(12) United States Patent
Wang

(10) Patent No.: US 12,167,549 B2
(45) Date of Patent: Dec. 10, 2024

(54) FLEXIBLE DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Wenqiang Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 426 days.

(21) Appl. No.: 17/621,326

(22) PCT Filed: Nov. 26, 2021

(86) PCT No.: PCT/CN2021/133410
§ 371 (c)(1),
(2) Date: Dec. 21, 2021

(87) PCT Pub. No.: WO2023/087366
PCT Pub. Date: May 25, 2023

(65) Prior Publication Data
US 2023/0164931 A1    May 25, 2023

(30) Foreign Application Priority Data
Nov. 22, 2021 (CN) .......................... 202111138455.2

(51) Int. Cl.
*H05K 5/00* (2006.01)

(52) U.S. Cl.
CPC .................. *H05K 5/0018* (2022.08)

(58) Field of Classification Search
CPC ... H05K 5/0018; G06F 1/1624; G06F 1/1637; G06F 1/1652; G06F 1/1609; G06F 1/1656; G06F 1/1626
See application file for complete search history.

(56) References Cited

U.S. PATENT DOCUMENTS

| 11,048,295 B1 * | 6/2021 | Smeeton | G09F 9/301 |
| 11,703,632 B2 * | 7/2023 | Wen | G02B 6/0081 |
| | | | 361/679.02 |

(Continued)

FOREIGN PATENT DOCUMENTS

| CN | 110792905 A | 2/2020 |
| CN | 110853520 A | 2/2020 |

(Continued)

OTHER PUBLICATIONS

CN113658510 (Year: 2021).*

*Primary Examiner* — Abhishek M Rathod
(74) *Attorney, Agent, or Firm* — Rivka Friedman

(57) ABSTRACT

The present application provides a flexible display panel and a display device. The display device includes a flexible display panel, and the flexible display panel includes a flexible display panel body and a support plate. A plurality of grooves are provided in a crimping portion of the support plate, and a plurality of first patterned structures are provided at a bottom of each of the grooves, so that a bending performance of the crimping portion can be improved while a rigidity of the crimping portion is ensured, thereby balancing crimpiness and flatness of the flexible display panel in the display device.

17 Claims, 8 Drawing Sheets

(56) References Cited

U.S. PATENT DOCUMENTS

| | | | |
|---|---|---|---|
| 2016/0163241 A1 | 6/2016 | Lee et al. | |
| 2016/0343964 A1 | 11/2016 | Kwon | |
| 2016/0357052 A1* | 12/2016 | Kim | G02F 1/133308 |
| 2017/0061836 A1 | 3/2017 | Kim et al. | |
| 2019/0132987 A1* | 5/2019 | Koo | H05K 7/18 |
| 2019/0207141 A1* | 7/2019 | Kim | H10K 77/111 |
| 2021/0165454 A1* | 6/2021 | Dong | G06F 1/1652 |
| 2021/0259119 A1* | 8/2021 | Seo | H04M 1/0268 |
| 2022/0343809 A1* | 10/2022 | Chen | G09F 9/301 |
| 2024/0045471 A1* | 2/2024 | Wang | G06F 1/1652 |

FOREIGN PATENT DOCUMENTS

| | | |
|---|---|---|
| CN | 110992828 A | 4/2020 |
| CN | 211928943 U | 11/2020 |
| CN | 112150925 A | 12/2020 |
| CN | 112150926 A | 12/2020 |
| CN | 112289750 A | 1/2021 |
| CN | 112863349 A | 5/2021 |
| CN | 112991953 A | 6/2021 |
| CN | 113129752 A | 7/2021 |
| CN | 113362712 A | 9/2021 |
| CN | 113658510 A | 11/2021 |

* cited by examiner

FLEXIBLE DISPLAY PANEL AND DISPLAY DEVICE

TECHNICAL FIELD

The present invention relates to a technical field of display, in particular to a flexible display panel and a display device.

BACKGROUND

With gradual maturity of flexible organic light-emitting diode (OLED) display technology, the display industry is developing in a direction of lighter, thinner, and larger. In recent years, folding OLED display technology has been widely used in mobile phone and tablet computer industries. However, a crease problem of a folding display device has not been properly solved so far. In order to enable a screen of the display device to have a display effect in which a size of the screen can be freely switched and to minimize the crease problem, a crimpable and stretchable OLED technology has emerged.

A key point of the crimpable and stretchable OLED display technology is that a flexible display panel needs to bear a stretching and crimping force of a crimping mechanism in a process of unfolding and retracting. This requires that a flexible display panel not only can adapt well to this stress environment, but also avoid a problem of a peeling of an adhesive layer and film layer inside a module. At the same time, it also requires the flexible display panel to have good flatness after unfolding.

Technical Problems

A support plate made of stainless steel is generally provided at a bottom of a flexible display panel for supporting the flexible display panel in order to accommodate a bending performance and a flatness of the flexible display panel. In order to ensure that the flexible display panel has a good bending and crimping performance, the support plate is often designed to be very thin. However, the less a bending and crimping radius of the flexible display panel is, the thinner a thickness of a selected support plate is. However, the thinner the thickness of the support plate, the worse the rigidity. After the flexible display panel is unfolded, the flatness cannot meet a requirement for use.

As described above, a conventional flexible display panel and a stretchable display device have problems in that the flexible display panel cannot balance crimpiness and flatness. Therefore, it is necessary to provide a flexible display panel and a display device to improve this defect.

SUMMARY

An embodiment of the present application provides a flexible display panel and a display device, which are used to solve a problem that a conventional support plate and a display device cannot balance crimpiness and flatness of the flexible display panel.

An embodiment of the present application provides a flexible display panel including a flexible display panel body, and a support plate disposed at a bottom of the flexible display panel body, wherein the flexible display panel body has a flexible portion, the support plate has a crimping portion corresponding to the flexible portion, the crimping portion is provided with a plurality of grooves extending along a first direction and spaced along a second direction, the first direction is different from the second direction;
wherein a bottom of each of the grooves is provided with a plurality of first patterned structures.

According to an embodiment of the present application, each of the first patterned structures extends through the support plate along a third direction perpendicular to the first direction and the second direction.

According to an embodiment of the present application, the first patterned structure extends along the first direction;
in the first direction, at least two of the first patterned structures are disposed side by side at a bottom of a same groove;
in the second direction, any two of the first patterned structures adjacent to each other are staggeredly arranged at the bottom of the same groove.

According to an embodiment of the present application, the first patterned structure comprises an intermediate patterned structure and an edge patterned structure, and the edge patterned structure extends from an edge of the crimping portion perpendicular to the first direction toward an intermediate of the crimping portion;
wherein, in the first direction, the edge patterned structure is disposed side by side with the intermediate patterned structure;
in the second direction, at least one intermediate patterned structure is disposed between any two of the edge patterned structures adjacent to each other, the edge patterned structure is staggered with the intermediate patterned structure adjacent to the edge patterned structure.

According to an embodiment of the present application, a cross-sectional profile of the intermediate patterned structure is elongated, and a cross-sectional profile of the edge patterned structure is U-shaped.

According to an embodiment of the present application, in the second direction, a distance between any of the grooves adjacent to each other is less than a width of the groove.

According to an embodiment of the present application, a ratio of the distance between any of the grooves adjacent to each other to the width of the groove is greater than or equal to 0.2 and less than or equal to 0.5.

According to an embodiment of the present application, in the second direction, a distance between any of the first patterned structures adjacent to each other is less than a width of the first patterned structure.

According to an embodiment of the present application, in the second direction, a ratio of the distance between of the first patterned structures adjacent to each other to the width of the first patterned structure is greater than or equal to 0.4 and less than or equal to 0.6.

According to an embodiment of the present application, a ratio of a distance between the bottom of the groove and a bottom of the support plate to a thickness of the support plate is greater than $1/3$ or equal to and less than or equal to $1/2$.

According to an embodiment of the present application, the support plate further comprises a transition portion connected to the crimping portion, the transition portion is provided with a plurality of second patterned structures.

According to an embodiment of the present application, each of the second patterned structures penetrates the support plate in the third direction.

According to an embodiment of the present application, each of the second patterned structures extends along the first direction;
in the first direction, at least two of the second patterned structures are disposed side by side;

in the second direction, any two of the second patterned structures adjacent to each other are disposed side by side.

According to an embodiment of the present application, a density of the second patterned structure is less than a density of the first patterned structure.

According to an embodiment of the present application, a length of the second patterned structure in the first direction is less than a length of the first patterned structure in the first direction.

According to an embodiment of the present application, in the second direction, a distance between any of the second patterned structures adjacent to each other is greater than a distance between any of the first patterned structures adjacent to each other.

According to an embodiment of the present application, a ratio of the distance between any of the second patterned structures adjacent to each other to the distance between any of the first patterned structures adjacent to each other is greater than or equal to 1.2 and less than or equal to 2.

According to an embodiment of the present application, a density of the second patterned structure is less than a density of the first patterned structure.

An embodiment of the present application further provides a display device including a flexible display panel, wherein the flexible display panel comprises a flexible display panel body, and a support plate disposed at a bottom of the flexible display panel body, the flexible display panel body has a flexible portion, the support plate has a crimping portion corresponding to the flexible portion, the crimping portion is provided with a plurality of grooves extending along a first direction and spaced along a second direction, the first direction is different from the second direction;

wherein a bottom of each of the grooves is provided with a plurality of first patterned structures.

According to an embodiment of the present application, each of the first patterned structures extends through the support plate in a third direction perpendicular to the first direction and the second direction.

According to an embodiment of the present application, the first patterned structure extends along the first direction;
in the first direction, at least two of the first patterned structures are disposed side by side at a bottom of a same groove;
in the second direction, any two of the first patterned structures adjacent to each other are staggeredly arranged at the bottom of the same groove.

Beneficial Effects

An embodiment of the present disclosure provides a flexible display panel and a display device, the display device including a flexible display panel, the flexible display panel including a flexible display panel body and a support plate, the support plate being disposed at a bottom of the flexible display panel body, the flexible display panel being provided with a flexible portion, the support plate being provided with a crimping portion corresponding to the flexible portion, a plurality of grooves extending along a first direction and spaced along a second direction are provided at the crimping portion, and a plurality of first patterned structures are provided at a bottom of the groove, so that a bending performance of the crimping portion can be improved while a rigidity of the crimping portion is ensured, thereby balancing crimpiness and flatness of the flexible display panel in the display device.

BRIEF DESCRIPTION OF THE DRAWINGS

In order to more clearly illustrate the embodiments or prior art solutions, the accompanying drawings required for use in the description of the embodiments or prior art will be briefly described below. It will be apparent that the accompanying drawings in the following description are merely some of the disclosed embodiments, and other drawings may be obtained from these drawings without creative effort by one of ordinary skill in the art.

DETAILED DESCRIPTION OF THE EMBODIMENTS

Figure 1:
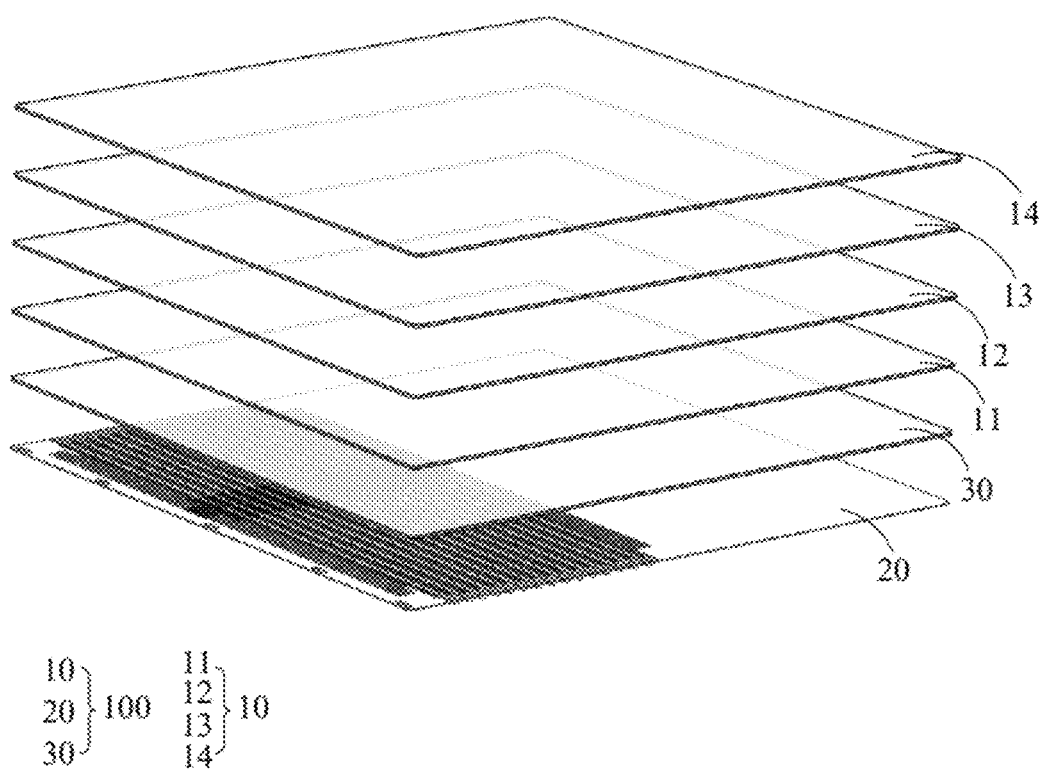
FIG. 1 is an exploded schematic diagram of a flexible display panel provided in an embodiment of the present application.

The following embodiments are described with reference to additional illustrations to illustrate specific embodiments that may be implemented by the present disclosure. The direction terms mentioned in the present disclosure, such as [upper], [lower], [front], [rear], [left], [right], [inner], [outer], [side], and the like, refer only to the directions of the additional drawings. Therefore, a direction term is used to explain and understand the present disclosure, and not to limit the present disclosure. In the figure, elements of similar structure are denoted by the same reference numerals.

The disclosure will be further described with reference to the accompanying drawings and specific embodiments:

The present embodiment provides a flexible display panel. As shown in FIG. 1, the flexible display panel 100 includes a flexible display panel body 10 and a support plate 20, and the support plate 20 may be disposed at a bottom of the flexible display panel body 10.

In an embodiment of the present application, the support plate 20 and the flexible display panel body 10 may be bonded by a foam tape 30. The foam tape 30 not only can provide good adhesive force, but also absorb a bending stress caused by a deformation of the support plate 20 during a bending process, thereby avoiding peeling between the support plate 20 and the flexible display panel body 10, thus reducing a risk of peeling and fracture failure in the flexible display panel 100.

The flexible display panel body 10 may include a back plate 11, a display layer 12, a polarizer 13, and a protective plate 14 that are sequentially laminated, and the display layer 12 may include a driving circuit layer and a plurality of light-emitting components disposed on the driving circuit layer in an array and electrically connected to the driving circuit layer.

In an embodiment of the present application, the light-emitting device in the display layer 12 may be an organic light-emitting diode. In practical use, a type of light-emitting device in the display layer 12 is not limited to an organic light-emitting diode, but may be a mini light-emitting diode (mini LED) or a smaller micro light-emitting diode (Micro LED).

The polarizer 13 is a polymer optical film having high polarization optical characteristics, high temperature resistance, high humidity resistance, and the like.

The protective plate 14 may be made of a transparent polymer material so that the protective layer has excellent optical characteristics and wear-and-scratch resistance, and functions as a protective display layer 12.

A material of the support plate 20 is stainless steel (SUS), so that the support plate 20 has a good rigidity and bending performance. Specifically, the support plate 20 may be a high-strength thin steel plate containing manganese, and nickel plated, with a single yield limit of no less than 1600 MPa, and is prepared through a cold-drawing process, and has excellent toughness and strength. In practical use, the material of the support plate 20 may include, but is not limited to, alloy materials such as titanium alloy, copper alloy, magnesium-aluminum alloy, or other metal materials, and may also be non-metallic materials such as carbon fiber composite plate.

Figure 2:
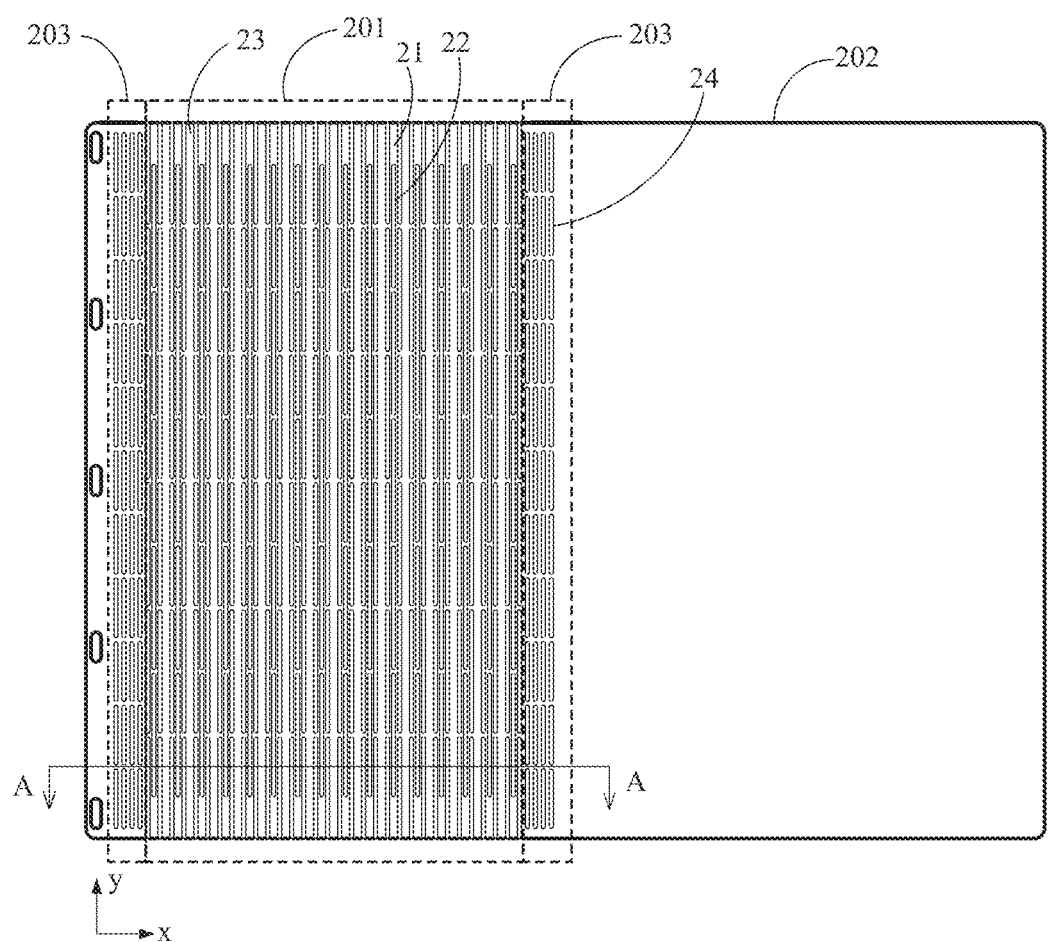
FIG. 2 is a structural schematic diagram of a support plate provided in an embodiment of the present application.

As shown in FIG. 2, FIG. 2 is a structural schematic diagram of a support plate provided in an embodiment of the present application. The support plate 20 includes a crimping portion 201 and a non-crimping portion 202. When the support plate 20 is in the unfolded state, the non-crimping portion 202 is provided on at least one side of the crimping portion 201. The crimping portion 201 is provided with a plurality of grooves 21 extending along a first direction y and spaced along a second direction x, and the first direction y is different from the second direction x. By providing a plurality of spaced grooves 21 in the crimping portion 201 of the support plate 20, overall rigidity of the crimping portion 201 can be reduced to improve the bending performance of the support plate 20.

In an embodiment of the present application, the first direction y is perpendicular to the second direction x, the first direction y is parallel to a width direction of the support plate, and the second direction x is parallel to a length direction of the support plate. In practical use, the first direction y and the second direction x may also cross each other, but not perpendicularly.

Figure 3:
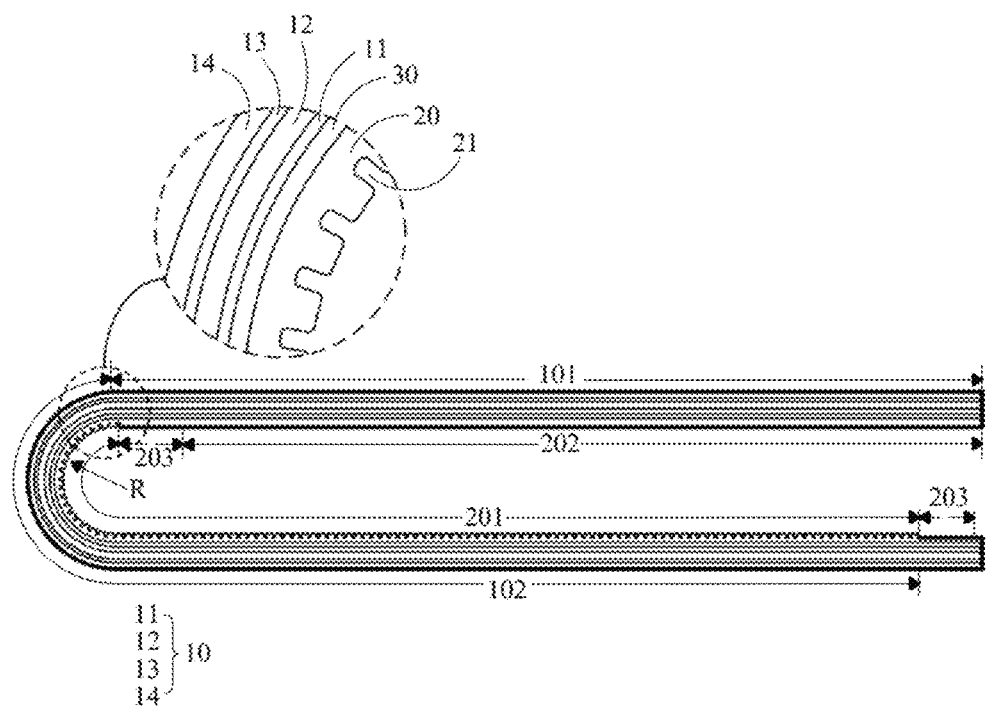
FIG. 3 is a structural schematic diagram of a flexible display panel in a bending state provided in an embodiment of the present application.

As shown in FIG. 3, FIG. 3 is a structural schematic diagram of a flexible display panel in a bending state provided in an embodiment of the present application. The flexible display panel body 10 has a planar portion 101, and a flexible portion 102 connected to the planar portion 101, and the crimping portion 201 corresponding to the flexible portion 102 and serves to support the flexible portion 102.

The flexible portion 102 has a good bending and folding performance. When the flexible portion 102 of the flexible display panel body 10 is bent, the back plate 11, the display layer 12, the polarizer 13, the protective plate 14 corresponding to a portion where the flexible portion 102 is bent are also in a bending state, and the support plate 20 corresponding to a portion where the flexible portion 102 is bent are also in the bending state. When the flexible portion 102 does not bend, the back plate 11, the display layer 12, the polarizer 13 and the protective plate 14 corresponding to a portion where the flexible portion 102 does not bend are in an unfolded state, and the crimping portion 201 corresponding to the portion where the flexible portion 102 does not bend is also in an unfolded state.

In an embodiment of the present application, an opening of the groove 21 is provided on a side away from the flexible display panel body 10 toward the support plate 20. It will be understood that at least a portion of the crimping portion 201 may be in a same plane with the non-crimping portion 202 when the flexible display panel body 10 is in the unfolded state, and that the function of supporting the flexible display panel body 10 is implemented together with the non-crimping portion 202. By providing the opening of the groove 21 on a side away from the flexible display panel body 10 toward the support plate 20, it is possible to avoid grooving the support plate 20 on a side facing the flexible display panel body 10 so that a surface of the support plate 20 on the side facing the flexible display panel body 10 becomes a flat surface, thereby ensuring a flatness of the flexible display panel body 10 in the unfolded state.

In an embodiment of the present application, a width of each of the grooves 21 in the second direction x is same, and a spacing distance between adjacent grooves 21 is also same, so that not only the manufacturing difficulty of the support plate 20 can be reduced, but also a curvature of each portion of the crimping portion 201 can be made uniform when the crimping portion 201 is in the bending state, so that the force applied to each portion of the crimping portion 201 can be more uniform.

In practical use, the width of the groove 21 may be gradually increased from an edge of the crimping portion 201 near the non-crimping portion 202 toward a center of the crimping portion 201. The greater the width of the groove 21, the smaller the rigidity of the crimping portion 201, so that the bending performance of the crimping portion 201 can be gradually increased in the direction from the edge of the crimping portion 201 near the non-crimping portion 202 toward the center of the crimping portion 201. Alternatively, the width of the groove 21 may be gradually decreased from the edge of the crimping portion 201 near the non-crimping portion 202 toward the center of the crimping portion 201.

Further, a bottom of the groove 21 is provided with a plurality of first patterned structures 22.

In an embodiment of the present application, as shown in FIG. 2, a plurality of first patterned structures 22 are provided at a bottom of each of the grooves 21, and the number and density of the first patterned structures 22 in the bottom of each of the grooves 21 are same.

In practical use, the number or density of the first patterned structures 22 in the bottom of each of the grooves 21 may also be different. The more or the denser the first patterned structures 22 in the bottom of the grooves 21, the smaller the bending rigidity of the crimping portion 201, and the better the bending performance of the crimping portion 201. For example, the number or density of the first patterned structure 22 in the bottom of the groove 21 may gradually increase or reduced from the edge of the crimping portion 201 near the non-crimping portion 202 toward the center of the crimping portion 201.

Figure 4:
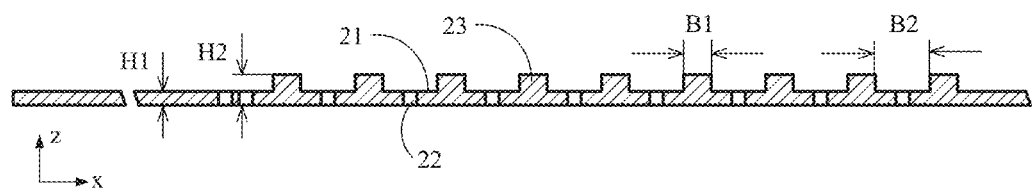
FIG. 4 is a cross-sectional view of the support plate along an A-A direction provided in an embodiment of the present application.

In an embodiment of the present application, as shown in FIG. 4, which is a cross-sectional view of the support plate provided in the embodiment of the present application along an A-A direction, the first patterned structure 22 extends through the support plate 20 in a third direction z perpendicular to the first direction y and the second direction x. In this way, the bending rigidity of the crimping portion 201 can be further reduced, and the bending performance of the support plate 20 can be improved. The portion between the adjacent grooves 21 can serve as a support spoke 23 to maintain the rigidity of the support plate 20, thereby ensuring the flatness of the display panel body 10 in the unfolded state.

Further, in the third direction z, a distance H1 between the bottom of the groove 21 and the bottom of the support plate 20 should be less than or equal to half of a thickness H2 of the support plate 20. The sum of a depth of the groove 21 and the distance H1 between the bottom of the groove 21 and the bottom of the support plate 20 is the thickness H2 of the support plate 20. The greater the depth of the groove 21 is, the better the bending performance of the crimping portion 201 is, and the smaller the bending rigidity is. In this way, it can be avoided that the bending performance of the crimping portion 201 cannot meet the demand of the flexible display panel due to the insufficient depth of the groove 21.

Further, a ratio of the distance H1 between the bottom of the groove 21 and the bottom of the support plate 20 to the thickness H2 of the support plate should be greater than or equal to ⅓ and less than or equal to ½, thereby balancing the rigidity and the bending performance of the support plate 20 at the crimping portion 201.

In an embodiment of the present application, the ratio of the distance H1 between the bottom of the groove 21 and the bottom of the support plate 20 to the thickness H2 of the support plate 20 is ½, the distance H1 between the bottom of the groove 21 and the bottom of the support plate 20 is 100 μm, and the thickness H2 of the support plate 20 is 200 μm. In practical use, the thickness H2 of the support plate is not limited to the above-mentioned 200 μm but may be greater than or less than 200 μm. When the thickness of the support plate 20 is thin, the ratio of the distance H1 between the bottom of the groove 21 and the bottom of the support plate 20 to the thickness H2 of the support plate 20 may also be ⅓ or ⅖.

In other embodiments, in the third direction z, the first patterned structure 22 may also extend only from the bottom of the groove 21 to the inside of the support plate 20, but not cross the support plate 20. In this way, the rigidity of the crimping portion 201 can be further reduced to some extent and the bending performance of the support plate 20 can be improved.

Figure 5:
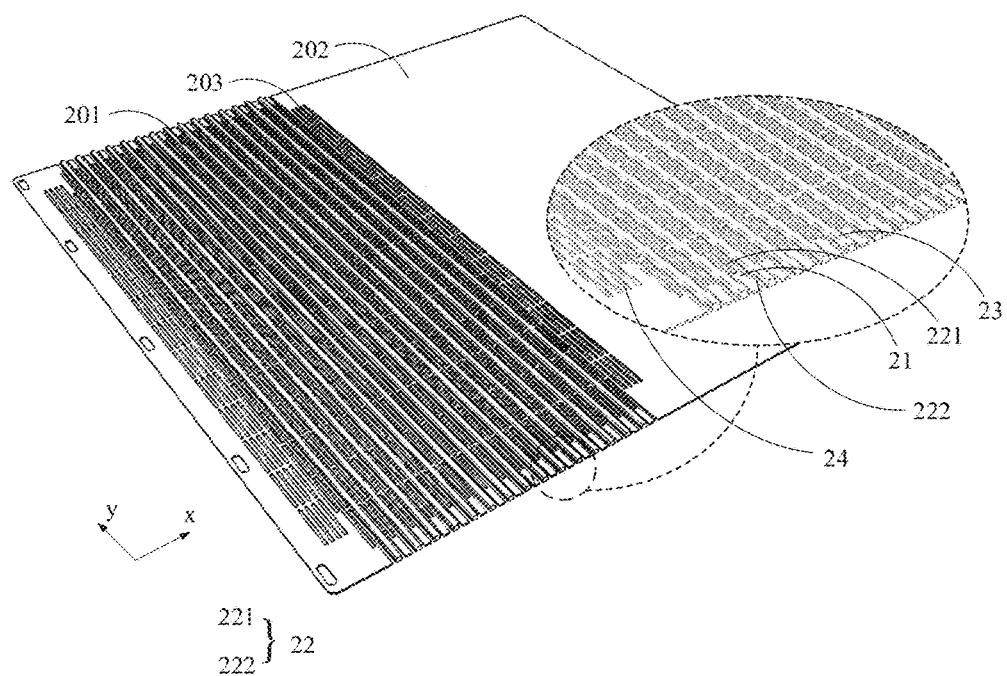
FIG. 5 is a schematic structural diagram of an edge portion of the support plate provided in an embodiment of the present application.
Figure 6:
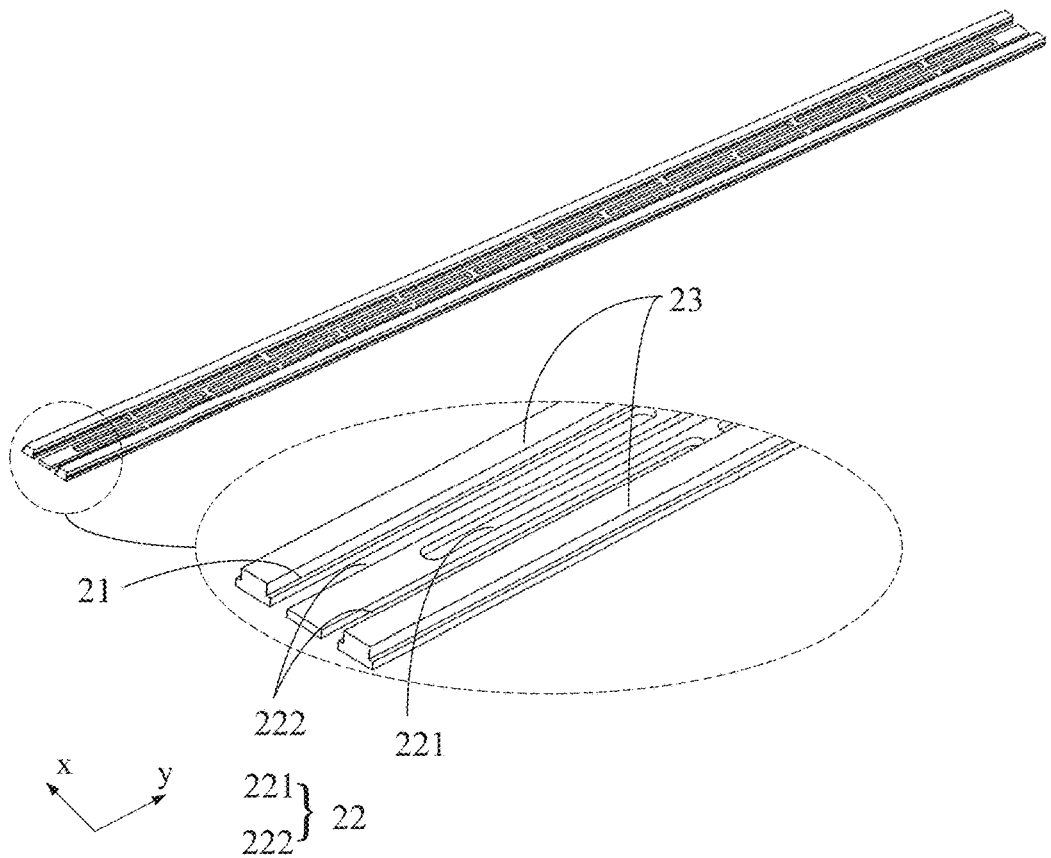
FIG. 6 is a partially enlarged schematic diagram of the edge portion of the support plate provided in an embodiment of the present application.

Further, as shown in FIGS. 5 and 6, FIG. 5 is a structural schematic diagram of an edge portion of a support plate provided in an embodiment of the present application. FIG. 6 is a partially enlarged schematic diagram of an edge portion of a support plate provided in an embodiment of the present application. The first patterned structure 22 extends along the first direction y. In the first direction y, at least two of the first patterned structures 22 are disposed side by side at a bottom of a same groove 21, In the second direction x, any two adjacent first patterned structures 22 are staggered at the bottom of the same groove 21.

In an embodiment of the present application, as shown in FIG. 6, a plurality of first patterned structures 22 are spaced and disposed side by side in the first direction y to form a row of first patterned structures 22, and three rows of first patterned structures 22 are provided in each groove 21. In the second direction x, any two adjacent first patterned structures 22 of any two adjacent rows of first patterned structures 22 are staggered.

In practical use, the number of rows of the first patterned structure provided in each of the grooves 21 may be selected according to the width of the grooves 21 and the bending performance required by the crimping portion 201 of the support plate 20, and may be not limited to three rows in the above-described embodiment, but may be two, four, five or more rows.

In other embodiments, a plurality of first patterned structures 22 are disposed side by side in a first direction y to form a row of first patterned structures 22, three rows of first patterned structures 22 are disposed within each groove 21. In the second direction x, any two adjacent first patterned structures 22 of any two adjacent rows of first patterned structures 22 are disposed side by side.

Further, as shown in FIG. 5, the first patterned structure 22 includes an intermediate patterned structure 221 and an edge patterned structure 222, and the edge patterned structure 222 extends from an edge of the crimping portion 201 perpendicular to the first direction y toward an intermediate of the crimping portion 201.

Combined FIG. 5 with FIG. 6, in the first direction y, the edge patterned structure 222 is disposed side by side with the intermediate patterned structure 221, and in the second direction x, at least one intermediate patterned structure 221 is disposed between any adjacent edge patterned structures 222, and the edge patterned structure 222 is staggered with the adjacent intermediate patterned structures 221. By providing a plurality of edge patterned structures 222 at the edge of the crimping portion 201 perpendicular to the first direction y, the deformation and the stress caused at the intermediate portion of the crimping portion 201 are dispersed to the edge portion of the crimping portion 201, thereby avoiding the stress of the intermediate portion and the edge portion of the crimping portion 201 from being excessively concentrated, and thus reducing the stress applied by the support plate 20 to the adjacent adhesive layer or film layer during the bending or crimping process.

In an embodiment of the present application, a length of the intermediate patterned structure 221 in the first direction y is greater than a length of the edge patterned structure in the first direction y. In practical use, the length of the intermediate patterned structure 221 in the first direction y may also be less than or equal to the length of the edge patterned structure 222 in the first direction y, which is not limited here.

Further, a cross-sectional profile of the intermediate patterned structure 221 is elongated, and a cross-sectional profile of the edge patterned structure 222 is U-shaped.

Figure 7:
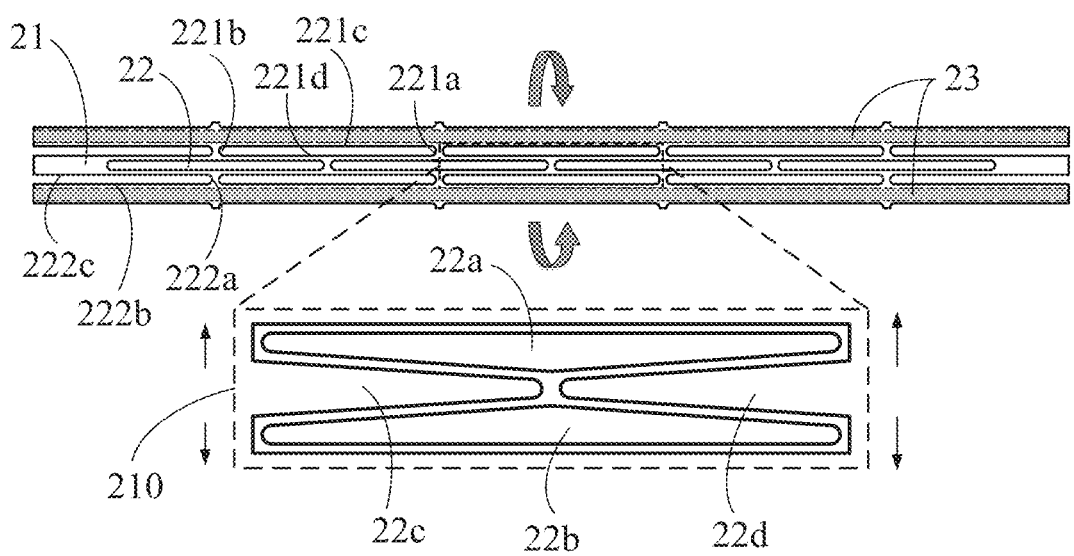
FIG. 7 is a principle diagram of a deformation of a crimping portion provided in an embodiment of the present application.

As shown in FIG. 7, FIG. 7 is a principle diagram of a deformation of a crimping portion provided in an embodiment of the present application. The cross-sectional profile of the intermediate patterned structure 221 paralleled to the first direction y and the second direction x has a first end portion 221a, a second end portion 221b, and a first connecting portion 221c and a second connecting portion 221d oppositely disposed. The first connecting portion 221c is connected to a side of the first end portion 221a and the second end portion 221b, and the second connecting portion 221d is connected to another side of the first end portion 221a and the second end portion 221b.

In one embodiment, the cross-sectional profiles of the first end portion 221a and the second end portion 221b are semicircular, and the cross-sectional profiles of the first connecting portion 221c and the second connecting portion 221d are linear.

In practical use, the cross-sectional profiles of the first end portion 221a and the second end portion 221b are not limited to be semicircular in the above-described embodiment, but may be semi-elliptical, curved-shaped having at least two bending portions with different bending directions, or other irregular shapes. The cross-sectional profiles of the first connecting portion 221c and the second connecting portion 221d are not limited to be semicircular in the above-described embodiment, but may be arcuate, curved-shaped having at least two bending portions with different bending direction, or other irregular patterns.

As shown in FIG. 7, The cross-sectional profile of the edge patterned structure 222 paralleled to the first direction y and the second direction x has a third end portion 222a, and a third connecting portion 222b and a fourth connecting portion 222c oppositely disposed. The third connecting portion 222b and the fourth connecting portion 222c are connected to the third end portion 222a, respectively.

In one embodiment, the cross-sectional profile of the third end portion 222a is semicircular, and the cross-sectional profiles of the third connecting portion 222b and the fourth connecting portion 222c are linear.

In practical use, the cross-sectional profiles of the third end portion 222a is not limited to be semicircular in the above-described embodiment, but may be semi-elliptical, curved-shaped having at least two bending portions with different bending directions, or other irregular shapes. The cross-sectional profiles of the third connecting portion 222b and the fourth connecting portion 222c are not limited to be semicircular in the above-described embodiment, but may be arcuate, curved-shaped having at least two bending portions with different bending direction, or other irregular patterns.

As shown in FIG. 7, FIG. 7 only illustrates one groove 21 and a plurality of rows of first patterned structures 22 located in the groove 21. The first patterned structure 22 includes a first sub-patterned structure 22a, a second sub-patterned structure 22b, a third sub-patterned structure 22c, and a fourth sub-patterned structure 22d. A deforming unit 210 is formed by the first sub-patterned structure 22a in an n-th row of sub-patterned structures, the third sub-patterned structure 22c and the fourth sub-patterned structure 22d in an n+1-th row of sub-patterned structures, and the second sub-patterned structure 22b in an n+2-th row of sub-patterned structures. The second sub-patterned structure 22b is disposed side by side with the first sub-patterned structure 22a, the third sub-patterned structure 22c and the fourth patterned structure 22d are disposed adjacent to the first sub-patterned structure 22a. The third sub-patterned structure 22c includes the first end portion, a portion of the first connecting portion, and a portion of the second connecting portion. The fourth sub-patterned structure 22d includes the second end portion, a portion of the first connecting portion, and a portion of the second connecting portion. The deformation unit 210 has an H-shaped structure, wherein n is a positive integer greater than or equal to 1. A deformation unit 210 is shown in the dotted line box of FIG. 7.

Figure 9:
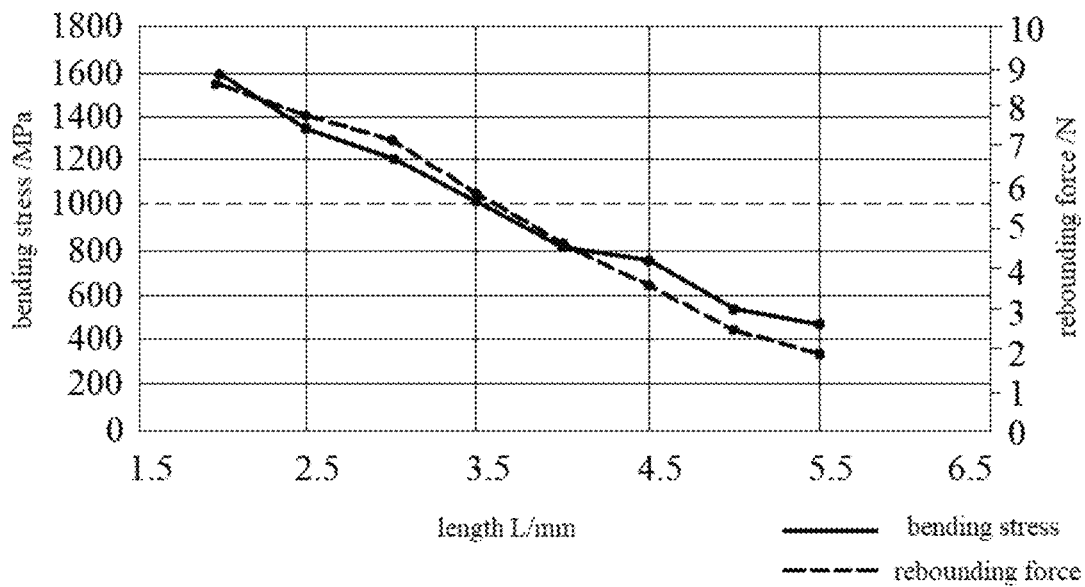
FIG. 9 is a relational graph of a length of a first patterned structure as a function of a bending stress and rebounding force.

In the process of returning the display device from the unfolded state to the retracted state, the crimping portion 201 may be bent from the unfolded state to the bending state along a direction indicated by the arrow. With an applied external tension, a portion of the first sub-patterned structure 22a, the second sub-patterned structure 22b, a portion of the third sub-patterned structure 22c, and a portion of the fourth sub-patterned structure 22d are gradually deformed and unfolded along the direction indicated by the arrow, that is, a portion of the first sub-patterned structure 22a, the second sub-patterned structure 22b, a portion of the third sub-patterned structure 22c, and a portion of the fourth sub-patterned structure 22d are gradually increased in the second direction x, so that the width of the groove 21 shown in the second direction x in FIG. 9 is increased. An accumulation of deform-to-unfold actions of each deformation unit 210 in the crimping portion 201 during the bending or crimping process provides the crimping portion 201 with a better deformation performance, which helps to release the stress generated during the bending or crimping process. Thus, it ensures that the foam tape 30 attached to the flexible display panel body 10 can maintain an excellent deformation-following property with the support plate 20, so that the crimping portion 201 of the support plate 20 during the bending or crimping process of the flexible display panel 100 can be deformed in coordination with the adjacent glue layer and the film layer, thereby reducing the risk of the film layer peeling and broken during the bending or crimping process of the flexible display panel 100.

Further, as shown in FIG. 6, in the second direction x, a distance B1 between any adjacent grooves 21 is less than a width B2 of the groove 21.

During bending or crimping of the support plate 20, the support spoke 23 between the adjacent grooves 21 is hardly deformed, and since the thickness H2 in the third direction z is greater than the thickness H1 between the bottom of the groove 21 and the bottom of the support plate 20, the support spoke 23 can maintain good support performance of the support plate 20 and ensure flatness of the flexible display panel body 10 in the unfolded state. However, if a width of the support spoke is too large, the bending rigidity of the crimping portion 201 is too large, and the bending performance cannot meet the requirements of the flexible display panel. Therefore, the distance B1 between any adjacent grooves 21 is limited to be less than the width B2 of the groove 21 so that the bending performance and rigidity performance of the support plate 20 can be balanced.

In practical use, the distance B1 between any adjacent grooves 21 may also be greater than or equal to the width B2 of the groove 21, which is not limited here.

Figure 8:
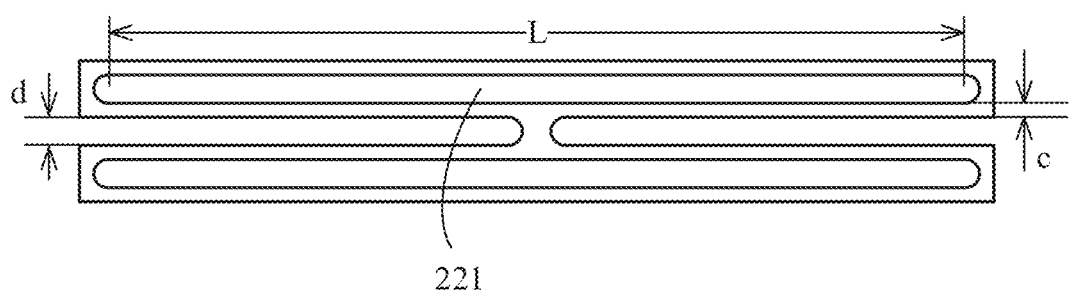
FIG. 8 is a plan schematic diagram of a deforming unit provided in an embodiment of the present application.

FIG. 8 is a plan schematic diagram of the deformation unit provided in an embodiment of the present application. FIG. 9 is a relational graph of a length of a first patterned structure as a function of a bending stress and rebounding force. It can be seen from FIG. 9 that a length L of the first patterned structure 22 in the first direction y is negatively correlated with the bending stress and the rebound stress of the support plate 20. The greater the length L of the first patterned structure 22 is, the less the bending stress and the rebound stress of the support plate 20 are.

In an embodiment of the present application, a fatigue limit stress reference value of raw material of the support plate after 200000 times of crimping is 1000 MPa, and the material selection limit breaking strength value of the support plate 20 is 1600 MPa. Taking the intermediate patterned structure 221 in FIG. 10 as an example, a length L of the intermediate patterned structure 221 in the first direction y is 6 mm, and the stress value of the support plate 20 is less than the fatigue limit stress reference value of the raw material of the support plate 20. In practical use, the length L of the intermediate patterned structure 221 in the first direction y is not limited to 4 mm in the above-described embodiment, but may be 3.5 mm, 4.5 mm, 5 mm, 5.5 mm, 6 mm, or the like, and only needs to be greater than or equal to 3.5 mm and less than or equal to 6 mm.

In an embodiment of the present application, the length of the edge patterned structure 222 in the first direction y should be less than the length L of the intermediate patterned structure 221.

Further, in the second direction x, a distance c between any adjacent first patterned structures 22 is less than a width d of the first patterned structures 22.

Figure 10:
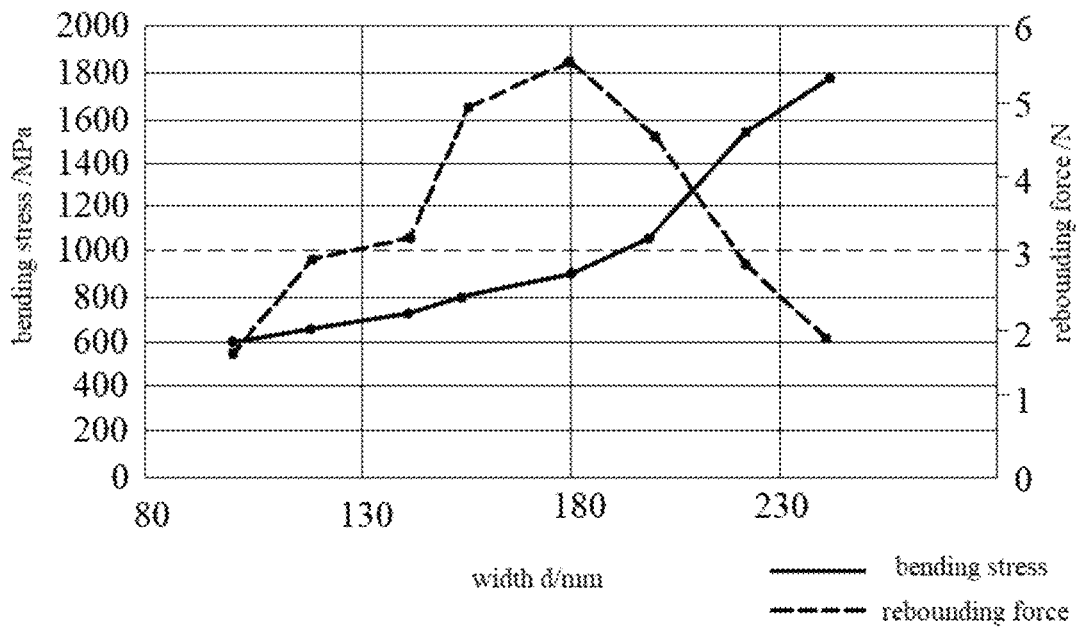
FIG. 10 is a relational graph of a width of an intermediate patterned structure in a second direction x as a function of a bending stress and rebounding force.

FIG. 10 is a relational graph of a width of a first patterned structure in a second direction x as a function of a bending stress and rebounding force. Taking the intermediate patterned structure 221 shown in FIG. 8 as an example, the width d of the intermediate patterned structure 221 in the second direction x is positively correlated with the bending stress of the support plate 20, that is, the greater the width d of the intermediate patterned structure 221 in the second direction x is, the greater the bending stress of the support plate 20 is, and when the width d of the intermediate patterned structure 221 in the second direction x is greater than 180 μm, the rate at which the bending stress of the support plate 20 increases is greater, and the bending stress of the support plate 20 gradually approaches and exceeds the fatigue limit stress reference value 1000 MPa of the raw material of the support plate 20.

When the width d of the intermediate patterned structure 221 in the second direction x is less than or equal to 180 μm, the width d of the intermediate patterned structure 221 in the second direction x is positively correlated with the rebounding force of the support plate 20, that is, the greater the width d of the intermediate patterned structure 221 in the second direction x is, the greater the rebounding force of the support plate 20 is, and when the width d of the intermediate patterned structure 221 in the second direction x is greater than or equal to 180 μm, the width d of the intermediate patterned structure 221 in the second direction x is negatively correlated with the rebounding force of the support plate 20, that is, the greater the width d of the intermediate patterned structure 221 in the second direction x is, the less the rebounding force of the support plate 20 is.

Figure 11:
FIG. 11 is a relational graph of a distance between adjacent first patterned structures as a function of a bending stress and rebounding force provided in an embodiment of the present application.

FIG. 11 is a relational graph of a distance between adjacent first patterned structures as a function of a bending stress and rebounding force provided in an embodiment of the present application. Taking the intermediate patterned structure 221 shown in FIG. 8 as an example, the distance c between adjacent intermediate patterned structures 221 is positively correlated with the bending stress and the rebounding force of the support plate 20. That is, the greater the distance c between adjacent intermediate patterned structures 221 is, the greater the bending stress and the rebounding force of the support plate 221 are. As can be seen from FIGS. 12 and 13, if the distance c between any adjacent intermediate patterned structures 221 is less than the width d of the intermediate patterned structure 221, the bending stress of the support plate 20 at the crimping portion 201 can be reduced, and the bending performance of the crimping portion 201 can be improved.

Further, in the second direction, a ratio of the distance between any adjacent first patterned structures 22 to the width of the first patterned structures 22 is greater than or equal to 0.4 and less than or equal to 0.6.

In an embodiment of the present application, taking the intermediate patterned structure 221 in FIG. 8 as an example, the width d of the intermediate patterned structure 221 in the second direction x is 200 μm, the distance c between any adjacent intermediate patterned structures 221 is 100 μm, and a ratio of the width d of the intermediate patterned structure 221 in the second direction x to the distance c between any adjacent intermediate patterned structure 221 is 0.5.

In practical use, the width d of the intermediate patterned structure 221 in the second direction x is not limited to 200 μm in the above-described embodiment, but may be 150 μm, 180 μm, 220 μm, or 240 μm, or the like, and only needs to be greater than or equal to 150 μm and less than or equal to 240 μm. The distance c between any adjacent intermediate patterned structures 221 is not limited to 100 μm in the above-described embodiment, but may be 20 μm, 40 μm, 60 μm, 80 μm, or 120 μm, or the like, and only need to be greater than or equal to 20 μm and less than or equal to 120 μm. A ratio of the distance c between any adjacent intermediate patterned structures to the width d of the intermediate patterned structures is not limited to 0.5 in the above-described embodiment, but may be 0.4 or 0.6 or the like, and only needs to be greater than or equal to 0.4 and less than or equal to 0.6.

In an embodiment of the present application, a width of the edge patterned structure 222 in the second direction x is same as the width of the intermediate patterned structure 221 in the second direction x.

In an embodiment of the present application, a distance between the edge patterned structure 222 and adjacent first patterned structure 22 in the second direction x is same as the distance between the adjacent first patterned structures 22.

In an embodiment of the present application, a bending radius R when the support plate is in the bending state is 3.6 mm. In practical use, the bending radius R when the support plate 20 is in the bending state is not limited to the above-described 3.6 mm, and the curvature radius when the support plate 20 is in the bending state can be selected according to an actual requirement. After determining the bending radius of the flexible display panel 10, the thickness of the support plate 20, and the depth of the groove 21, the length L1 of the first patterned structure 22, the width b of the first patterned structure and the distance c between the adjacent first patterned structures can be determined by mechanical simulation analysis and actual test results, so that the crimping portion 201 of the support plate 20 has the optimum bending performance and the risk of film peeling or fracture failure of the flexible display panel 100 is reduced.

Further, the support plate 20 further includes a transition portion 203 connected to the crimping portion 201, the transition portion 203 is provided with a plurality of second patterned structures 24.

As shown in FIG. 2, the support plate 20 has two transition portions 203 respectively disposed on opposite sides of the crimping portion 201 and connected to the crimping portion 201, and a non-crimping portion 202 is disposed on a side of the transition portion 203 away from the crimping portion 201 and connected to the transition portion 203.

In one embodiment, as shown in FIG. 4, the second patterned structure 24 may extend through the support plate 20 in the third direction z. Thus, the rigidity of the transition portion 203 can be reduced and the bending performance of the transition portion can be improved. In the process of crimping or bending the support plate 20, it is possible to avoid an occurrence of fracture failure of the support plate due to excessive force on the transition portion 203, thereby improving the tensile resistance and reliability of the support plate 20.

In one embodiment, the second patterned structure 24 may also protrude into the support plate 20 in the third direction z, but not through the support plate 20. Thus, the rigidity of the transition portion 203 can be reduced to some extent and the bending performance of the transition portion 203 can be improved.

Further, the second patterned structure 24 extends along the first direction y in which at least two of the second patterned structures 24 are disposed side by side, and any two adjacent second patterned structures 24 are disposed side by side or staggered in the second direction x.

In one embodiment, as shown in FIG. 4, in the first direction y, a plurality of second patterned structures 24 are spaced and disposed side by side to form a row of second patterned structures 24. In the second direction x, the transition portion 203 is provided with a plurality of rows of second patterned structures 24, and any two adjacent second patterned structures 24 of any two adjacent rows of second patterned structures 24 are disposed side by side.

In one embodiment, in the first direction y, a plurality of second patterned structures 24 are spaced and disposed side by side to form a row of second patterned structures 24. In the second direction x, the transition portion 203 is provided with a plurality of rows of second patterned structures 24, and any two adjacent second patterned structures 24 of any two adjacent rows of second patterned structures 24 may be staggered.

Further, the density of the second patterned structure 24 is less than the density of the first patterned structure 22 by reducing the density of the second patterned structure 24 in the transition portion 203, the rigidity of the transition portion 203 can be appropriately reduced, thereby avoiding the occurrence of fracture failure due to excessive local stress on the transition portion 203.

Further, the length of the second patterned structure 24 in the first direction y is less than the length of the first patterned structure 22 in the first direction y. Since the length of the second patterned structure 24 is negatively correlated with the bending stress and the rebounding force of the support plate 20, the bending rigidity of the transition portion 203 is greater than the bending rigidity of the crimping portion 201, so that not only the occurrence of fracture failure due to the excessive local force of the transition portion 203 is avoided, but also the support property of the support plate 203 can be improved, thereby ensuring the flatness of the flexible display panel 100 in the unfolded state.

Further, in the second direction x, the distance between any adjacent second patterned structures 24 is greater than the distance between any adjacent first patterned structures 22. It can be understood that the distance between the adjacent second patterned structures 24 is positively correlated with the rigidity of the transition portion 203, and the greater the distance between the adjacent second patterned structures 24 is, the greater the rigidity of the transition portion 203 is. In this way, the rigidity of the transition portion 203 can be greater than the rigidity of the crimping portion 201 while satisfying that the transition portion 203 has a certain deformation capability, so that the occurrence of fracture failure due to excessive local force on the transition portion 203 can be avoided, and the support property of the transition portion 203 can be ensured.

Further, in the second direction x, a ratio of the distance between any adjacent second patterned structures 24 to the distance between any adjacent first patterned structures 22 is 2. In practical use, a ratio of the distance between any adjacent second patterned structures 24 to the distance between any adjacent first patterned structures 22 is not limited to 2 in the above-described embodiment, but may be 1.2, 1.5, or 1.8, or the like, and only needs to be greater than or equal to 1.2 and less than or equal to 2.

In an embodiment of the present application, in the second direction x, the width of the first patterned structure 22 is same as the width of the second patterned structure 24, thereby ensuring the consistency of the processing of the first patterned structure 22 and the second patterned structure 24, thereby reducing the processing difficulty of the support plate.

Figure 12:
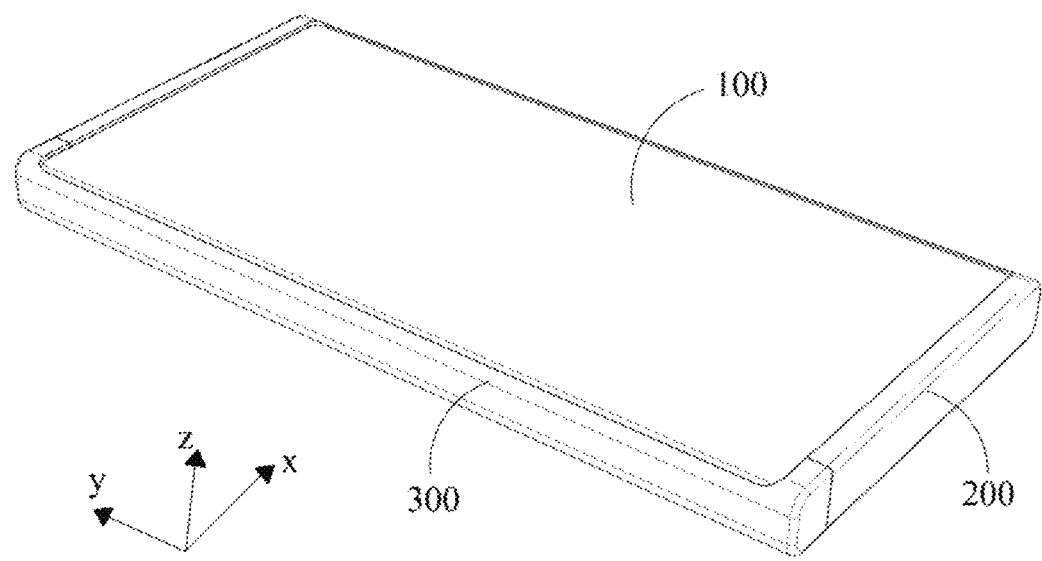
FIG. 12 is a structural schematic diagram of a display device in a retracted state provided in an embodiment of the present application.

A display device is provided in an embodiment of the present application, as shown in FIG. 12, FIG. 12 is a structural schematic diagram of a display device in a retracted state provided in an embodiment of the present application. The display panel includes a first middle frame 200, a second middle frame 300, and a flexible display panel 100 as described in the above-described embodiment. A portion of the flexible display panel may be fixed to the first middle frame 200 for realizing an image display function in the retracted state. A non-crimping portion 202 of the support plate 20 used for supporting the portion of the flexible display panel body is disposed in the first middle frame 200. Another portion of the flexible display panel 100 may be retracted in an accommodation space in the first middle frame 200 and the second middle frame 300, thereby improving the portability of the display device. The crimping portion 201 of the support plate 20 is used to support the portion of the flexible display panel 100 retracted in the first middle frame 200 and the second middle frame 300, and is used to drive the portion of the flexible display panel to slide.

Figure 13:
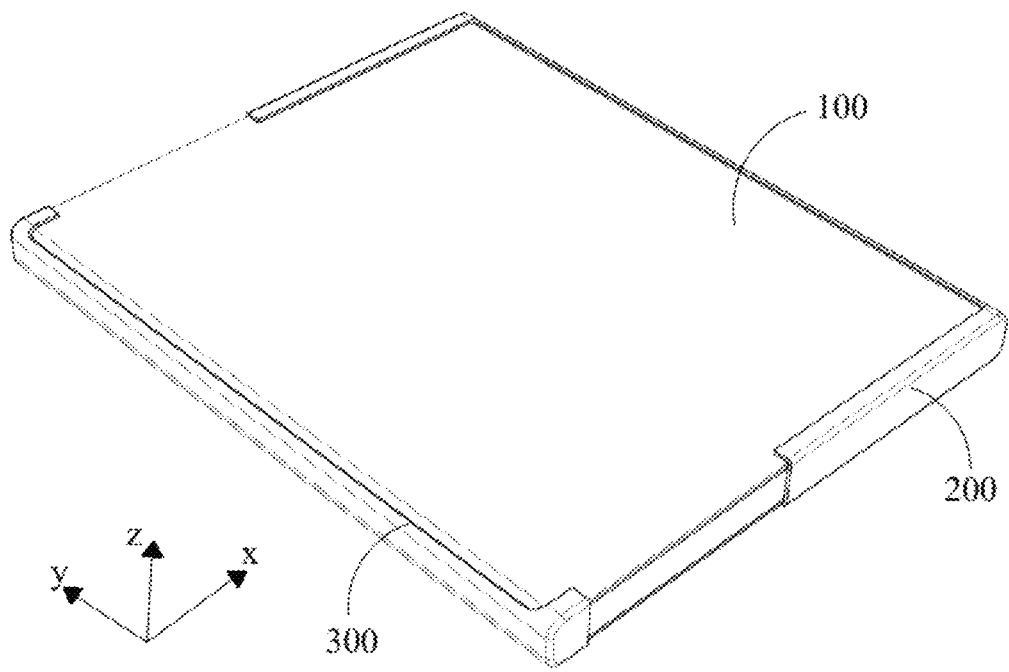
FIG. 13 is a structural schematic diagram of a display device in an unfolded state provided in an embodiment of the present application.

As shown in the FIG. 13, which is a structural schematic diagram of the display device provided in an embodiment of the present application in an unfolded state, the second middle frame 300 is slidably connected to the first middle frame 200. In a process in which the second middle frame 300 gradually moves away from the first middle frame 200 along the second direction x, the portion of the flexible display panel 100 accommodated in the accommodation space of the first middle frame 200 and the second middle frame 300 may gradually appear, and may be on a same plane as the portion of the flexible display panel 100 that are not accommodated, thus realizing a function of larger area display in the unfolded state.

During a process in which the display device stretches from the retracted state to the unfolded state, the crimping portion 201 of the support plate 20 may gradually slide through an arcuate side wall of the second middle frame 300 to a same plane as the non-crimping portion 202, and drive the flexible display panel body 20 fixed to the crimping portion 201 to gradually appear from the accommodation space of the first middle frame 200 and the second middle frame 300.

In an embodiment of the present application, the support plate 20 is provided with only one crimping portion 201, only the second middle frame 300 in the display device can be stretched unilaterally with respect to the first middle frame 200, and the crimping portion 201 slides through the arcuate side wall of the second middle frame 300. In practical use, the support plate 20 may have two or more crimping portions 201 when the display device can be stretched bilaterally or multilaterally.

The display device provided in an embodiment of the present application may be a mobile terminal such as a smartphone, a tablet computer, a notebook computer, or the like, or the display device may also be a wearable terminal such as a smartwatch, a smart band, smart glasses, an augmented reality device, or the display device may also be a fixed terminal such as a desktop computer, a television, or the like.

In an embodiment of the present application, the display device may further include a winding mechanism for rendering the flexible display panel 100 to be in an unfolded state or a retracted state, and electronic components such as a power supply and a drive integrated circuit board for driving the flexible display panel to implement a screen display function. The winding structure, the power supply, the drive integrated circuit board, and the like may be disposed in the accommodation space of the first middle frame 200 and/or the second middle frame 300.

An embodiment of the present application provides a flexible display panel and a display device. The display device includes a flexible display panel, the flexible display panel includes a flexible display panel body and a support plate, the support plate is provided at a bottom of the flexible display panel body, the support plate has a crimping portion. A plurality of grooves extending along the first direction and spaced along the second direction are provided at the crimping portion, and a plurality of first patterned structures are provided at a bottom of the grooves, so that a bending performance of the crimping portion can be improved while the rigidity of the crimping portion is ensured, thereby balancing crimpiness and flatness of the flexible display panel in the display device.

In summary, although the present application discloses the foregoing preferred embodiment, the foregoing preferred embodiment is not intended to limit the present application. A person of ordinary skill in the art may make various changes and finishes without departing from the spirit and scope of the present application. Therefore, the scope of protection of the present application is based on the scope defined by the claims.

What is claimed is:

1. A flexible display panel, comprising a flexible display panel body, and a support plate disposed at a bottom of the flexible display panel body, wherein the flexible display panel body has a flexible portion, the support plate has a crimping portion corresponding to the flexible portion, the crimping portion is provided with a plurality of grooves extending along a first direction and spaced along a second direction, the first direction is different from the second direction;
   wherein a bottom of each of the grooves is provided with a plurality of first patterned structures;
   wherein the support plate further comprises a transition portion connected to the crimping portion, the transition portion is provided with a plurality of second patterned structures;
   wherein in the second direction, a ratio of a distance between any of the second patterned structures adjacent to each other to a distance between any of the first patterned structures adjacent to each other is greater than or equal to 1.2 and less than or equal to 2.

2. The flexible display panel of claim 1, wherein each of the first patterned structures extends through the support plate along a third direction perpendicular to the first direction and the second direction.

3. The flexible display panel of claim 2, wherein the first patterned structure extends along the first direction;
   in the first direction, at least two of the first patterned structures are disposed side by side at a bottom of a same groove;
   in the second direction, any two of the first patterned structures adjacent to each other are staggered at the bottom of the same groove.

4. The flexible display panel of claim 3, wherein the first patterned structure comprises an intermediate patterned structure and an edge patterned structure, and the edge patterned structure extends from an edge of the crimping portion perpendicular to the first direction toward an intermediate of the crimping portion;
   wherein, in the first direction, the edge patterned structure is disposed side by side with the intermediate patterned structure;
   in the second direction, at least one intermediate patterned structure is disposed between any two of the edge patterned structures adjacent to each other, the edge patterned structure is staggeredly arranged with the intermediate patterned structure adjacent to the edge patterned structure.

5. The flexible display panel of claim 4, wherein a cross-sectional profile of the intermediate patterned structure is elongated, and a cross-sectional profile of the edge patterned structure is U-shaped.

6. The flexible display panel of claim 3, wherein in the second direction, a distance between any of the grooves adjacent to each other is less than a width of the groove.

7. The flexible display panel of claim 6, wherein in the second direction, a ratio of the distance between any of the grooves adjacent to each other to the width of the groove is greater than or equal to 0.2 and less than or equal to 0.5.

8. The flexible display panel of claim 3, wherein in the second direction, a distance between any of the first patterned structures adjacent to each other is less than a width of the first patterned structure.

9. The flexible display panel of claim 8, wherein in the second direction, a ratio of the distance between of the first patterned structures adjacent to each other to the width of the first patterned structure is greater than or equal to 0.4 and less than or equal to 0.6.

10. The flexible display panel of claim 3, wherein in the third direction, a ratio of a distance between the bottom of the groove and a bottom of the support plate to a thickness of the support plate is greater than ⅓ or equal to and less than or equal to ½.

11. The flexible display panel of claim 1, wherein each of the second patterned structures penetrates the support plate in the third direction.

12. The flexible display panel of claim 1, wherein each of the second patterned structures extends along the first direction;
   in the first direction, at least two of the second patterned structures are disposed side by side;
   in the second direction, any two of the second patterned structures adjacent to each other are disposed side by side.

13. The flexible display panel of claim 12, wherein a density of the second patterned structure is less than a density of the first patterned structure.

14. The flexible display panel of claim 12, wherein a length of the second patterned structure in the first direction is less than a length of the first patterned structure in the first direction.

15. A display device, comprising a flexible display panel, wherein the flexible display panel comprises a flexible display panel body, and a support plate disposed at a bottom of the flexible display panel body, the flexible display panel body has a flexible portion, the support plate has a crimping portion corresponding to the flexible portion, the crimping portion is provided with a plurality of grooves extending along a first direction and spaced along a second direction, the first direction is different from the second direction;

wherein a bottom of each of the grooves is provided with a plurality of first patterned structures;

wherein the support plate further comprises a transition portion connected to the crimping portion, the transition portion is provided with a plurality of second patterned structures;

wherein in the second direction, a ratio of a distance between any of the second patterned structures adjacent to each other to a distance between any of the first patterned structures adjacent to each other is greater than or equal to 1.2 and less than or equal to 2.

16. The display device of claim 15, wherein each of the first patterned structures extends through the support plate in a third direction perpendicular to the first direction and the second direction.

17. The display device of claim 16, wherein the first patterned structure extends in the first direction;

in the first direction, at least two of the first patterned structures are disposed side by side at a bottom of a same groove;

in the second direction, any two of the first patterned structures adjacent to each other are staggered at the bottom of the same groove.

* * * * *